US005526525A

United States Patent [19]
Minowa et al.

[11] Patent Number: 5,526,525
[45] Date of Patent: Jun. 11, 1996

[54] RADIO TRANSCEIVER IN WHICH THE LENGTH IS DIMENSIONED BASED ON POWER OUTPUT REQUIREMENT

[75] Inventors: Yoshio Minowa; Yuhei Kosugi, both of tokyo, Japan

[73] Assignee: NEC Corporation, Tokyo, Japan

[21] Appl. No.: 281,979

[22] Filed: Jul. 29, 1994

[30] Foreign Application Priority Data

Jul. 29, 1993 [JP] Japan .................................. 5-207090

[51] Int. Cl.$^6$ ........................................................ H04B 1/38
[52] U.S. Cl. ............................ 455/90; 455/128; 455/347; 361/709; 361/714; 361/814
[58] Field of Search .............................. 455/89, 90, 128, 455/129, 347, 3.2; 361/709–711, 714, 723, 704, 814

[56] References Cited

U.S. PATENT DOCUMENTS

| | | | |
|---|---|---|---|
| 4,717,989 | 1/1988 | DeBarros et al. | 361/709 |
| 4,763,225 | 8/1988 | Frenkel et al. | 361/714 |
| 5,243,306 | 9/1993 | Minowa et al. | |
| 5,305,185 | 4/1994 | Samarov et al. | 361/704 |
| 5,428,504 | 6/1995 | Bhatla | 361/704 |

FOREIGN PATENT DOCUMENTS

| | | |
|---|---|---|
| 264819 | 6/1992 | Japan . |
| 329030 | 12/1992 | Japan . |

*Primary Examiner*—Andrew I. Faile
*Attorney, Agent, or Firm*—Sughrue, Mion, Zinn, Macpeak & Seas

[57] ABSTRACT

A radio transceiver having an integrated transmitter and receiver for transmitting and receiving microwaves or higher frequency electromagnetic waves is one of a series of device products corresponding to different transmission output power capacities. In this invented series of device products, a radio transceiver which is of a minimum size to meet its transmission output power requirement without an amplifier is composed of entirely standardized basic components, a transmission module, a reception module, and a transmission and reception shared circuit which are housed in a heat radiating housing case irrespective of different transmission output power requirements. Corresponding to the transmission output power requirement, a power amplifier is added to the basic components. The heat radiating housing case which houses the basic components and the power amplifier is longer than, but has the same cross section as, the heat radiating housing case which houses no power amplifier, thereby radiating the heat produced by the power amplifier. The heat radiating housing case is thus substantially standardized.

5 Claims, 8 Drawing Sheets

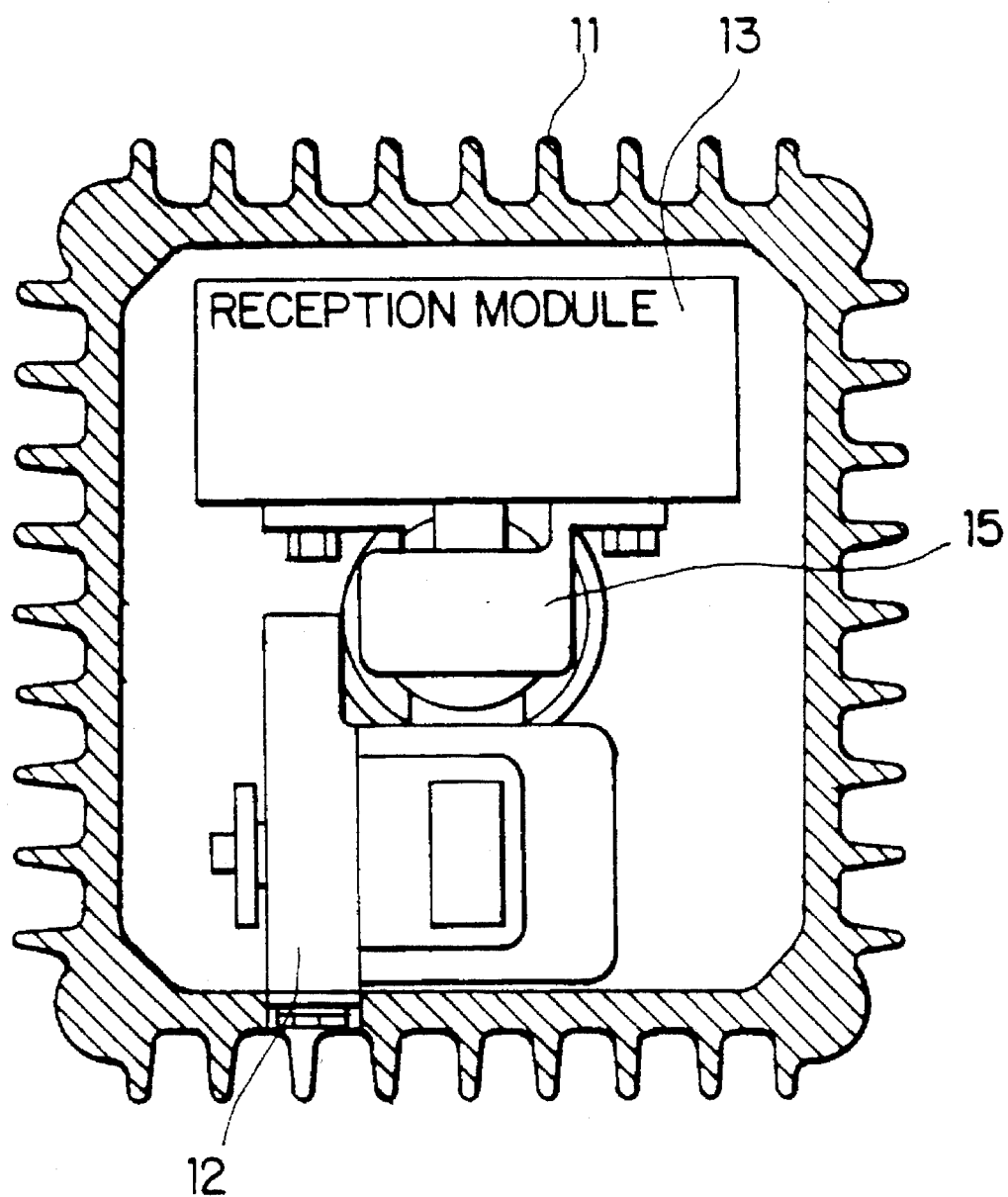

RADIO TRANSCEIVER IN WHICH THE LENGTH IS DIMENSIONED BASED ON POWER OUTPUT REQUIREMENT

BACKGROUND OF THE INVENTION

1. Field of the Invention

The present invention relates to a transceiver for radio communications, and more particularly to a radio transceiver with an integrated transmitter and receiver for transmitting and receiving microwaves or higher frequency electromagnetic waves, the radio transceiver being one of a series of device products having different transmission output power capacities.

Radio transceivers having an integrated transmitter and receiver are characterized by small size. Because radio transceivers are small in size, they may be positioned close to an antenna or integrally combined with an antenna, and consequently, the radio device requires no station buildings or shelters and hence can be installed at a low cost. The size of such radio transceivers is an important factor to be considered. Since the size of a radio transceiver varies according to the size of a cooling radiator, the size of the transceiver varies in proportion to the transmission output power capacities of the transceiver. It is therefore increasingly important to produce a series of models having different transmission output power capacities.

2. Description of the Related Art

Radio transceivers having an integrated transmitter and receiver for transmitting and receiving radio-waves such as microwaves or higher frequency electromagnetic waves have been available in a series of models which are operable in the same frequency band and the same signal processing format and have different transmission output power capacities. There have heretofore been three alternative design approaches to produce such a series of radio transceivers.

The first process is to individually design radio transceivers with different transmission output power capacities. Generally, the total quantity of heat generated by a radio transceiver depends greatly on the output power of a transmission power amplifier thereof. Therefore, the area of a heat radiating plate and the size of the device vary in proportion to the magnitude of the output power of the transmission power amplifier. According to the first approach, therefore, all the dimensions including the length, width, and height of the device housing, and the size of the heat radiating plate can be designed to optimally meet the output power requirement of the transmission power amplifier.

According to the second design principle, the basic device design is carried out with respect to a type having a highest transmission output power capacity, and a type having a lower transmission output power capacity is manufactured by replacing a power amplifier in the basic type with a simple transmission line. This design approach allows the use of a device housing and heat radiating plate of the same sizes in models having different transmission output power capacities.

More specifically, a transceiver having a smaller transmission output power capacity is shown in cross section in FIG. 1, and a transceiver having a greater transmission output power capacity is shown in cross section in FIG. 2. In FIGS. 1 and 2, heat radiating housing case 1 accommodates therein transmission module 2a or 2b, reception module 3, common circuit and IDU (indoor unit) communication signal combining circuit 4, and transmission and reception shared circuit 5.

The transceiver having a greater transmission output power capability shown in FIG. 2 has a power amplifier 7 disposed in transmission module 2b. Heat radiating housing case 1 shown in FIG. 2 has a maximum radiator area and a size which are selected to dissipate an amount of heat which is produced by the maximum electric power consumption to meet a maximum transmission output power requirement. The transceiver having a smaller transmission output power capability shown in FIG. 1 has transmission line 6 instead of power amplifier 7 in transmission module 2a. The heat radiating housing case 1 shown in FIG. 1 is, however, identical to the heat radiating housing case 1 shown in FIG. 2.

According to the third design plan, a power amplifier is attached as an independent exterior unit to a device casing to accommodate thereby various models having different transmission output power capacities. With the third design approach, the size of the device housing of a transceiver with a minimum transmission output power requirement can be used as a base size.

The first design principle is disadvantageous in that the device casing and components are not sufficiently standardized, resulting in an increase in the cost of those products in the series which do not enjoy high sales, as well as an increase in the time required by the manufacturing process before shipment.

Better standardization can be achieved by the second design program. However, since the basic design is based on the a transceiver having a greater transmission output power capacity, the heat radiating housing case 1 are large, as is the size of the device. No substantial economic problem arises if a larger proportion of models providing larger transmission output power are sold, but if more models providing smaller transmission output power are sold, the second design approach is not economical.

More specifically, since a transceiver having a smaller transmission output power capacity shown in FIG. 1 has no power amplifier, the entire electric consumption of the device is low and the device does not need a large radiator. However, the size of the device remains the same as a device with the larger transmission output power capacity because the basic model is the model with the higher output power. Accordingly, standardization based on the higher-out-put-power model is not beneficial for the lower-output-power model. If there is a greater demand in the market for the lower-output-power model, the extra cost involved in producing a device in an overly large case may result in a reduced ability to compete against another manufacturer's smaller and less expensive designs.

The second design process is also problematic if it should become necessary to produce a model having a higher transmission output power capacity than can be handled by the original design. When such a model is required, since the existing device housing lacks the physical space to accommodate a heat radiator for cooling a power amplifier of greater output power, it is necessary to redesign a transceiver with a greater transmission output power capability together with its housing.

A transceiver designed according to the third design approach is complex in structure. Specifically, because one antenna and one indoor unit connection cable are shared by the transmission and reception functions, it is necessary to take transmission output power out of the device, amplify the transmission output power with the exterior amplifier unit, and return the amplified transmission output power back into the device to supply a transmission and reception shared circuit. Inasmuch as the transceiver is compact and has a horn attached directly in combination with an antenna reflector, the exterior amplifier unit cancels out any merit provided by the integration of transmitter and receiver.

According to the third design principle, furthermore, because the length of the cable connected to the exterior amplifier unit is long compared with the wavelength, a standing wave is produced introducing ripples into the frequency characteristics if the voltage standing wave ratio in the transmission and reception shared circuit, the transmission module, the power amplifier, etc. is not sufficiently small. To prevent the generation of such a standing wave, it is effective to add an irreversible circuit element called an isolator to each module. However, adding such an irreversible circuit element is expensive.

SUMMARY OF THE INVENTION

It is therefore an object of the present invention to provide a radio transceiver with an integrated transmitter and receiver for transmitting and receiving microwaves or higher frequency electromagnetic waves. The radio transceiver has a basic design based on a basic model having a small transmission output power. To create a model having a high transmission power capacity, the basic design also allows the addition of a power amplifier to the basic model along with a housing case having radiating fins for dissipating the heat generated by the added power amplifier, thereby allowing a radio transceiver of a minimum arrangement to meet any transmission output power requirements.

To achieve the above object, there is provided in accordance with the present invention a radio transceiver with an integrated transmitter and receiver for transmitting and receiving microwaves or higher frequency electromagnetic waves, comprising a heat radiating housing case, a transmission module housed in the heat radiating housing case for generating a transmission signal, a reception module housed in the heat radiating housing case for demodulating a received signal, a transmission and reception shared circuit housed in the heat radiating housing case for outputting the transmission signal to an antenna and outputting a signal received by the antenna to the reception module, and a power amplifier insertable between an output terminal of the transmission module and a transmission signal input terminal of the transmission and reception shared circuit for amplifying the transmission signal depending on a transmission output power requirement, wherein said heat radiating housing case which accommodates the modules including the power amplifier is longer along the longitudinal direction than the heat radiating housing case having no power amplifier.

According to the present invention, there is also provided a radio transceiver with an integrated transmitter and receiver for transmitting and receiving microwaves or higher frequency electromagnetic waves, comprising a heat radiating housing case, a transmission module housed in the heat radiating housing case for generating a transmission signal, a reception module housed in the heat radiating housing case for demodulating a received signal, a transmission and reception shared circuit housed in the heat radiating housing case for outputting the transmission signal to an antenna and outputting a signal received by the antenna to the reception module, and a power amplifier insertable between an output terminal of the transmission module and a transmission signal input terminal of the transmission and reception shared circuit for amplifying the transmission signal depending on a transmission output power requirement, wherein the size of the power amplifier may be increased corresponding to a required output power and the heat radiating housing case having the same cross section may be extended lengthwise according to the length necessary to accommodate the extended power amplifier and corresponding radiator.

Preferably, the power amplifier may comprise a plurality of interconnected unit amplifiers each for amplifying the transmission signal corresponding to a predetermined transmission output power requirement. The transmission module and the power amplifier may be held closely against and fixed to an inner wall of the heat radiating housing case. The transmission module, the power amplifier, and the transmission and reception shared circuit may be interconnected by waveguides.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 6(A) and 6(B) are longitudinal and transverse cross-sectional views, respectively, of the radio transceiver according to the first embodiment shown in FIG. 3

DETAILED DESCRIPTION OF THE PREFERRED EMBODIMENTS

Figure 1:
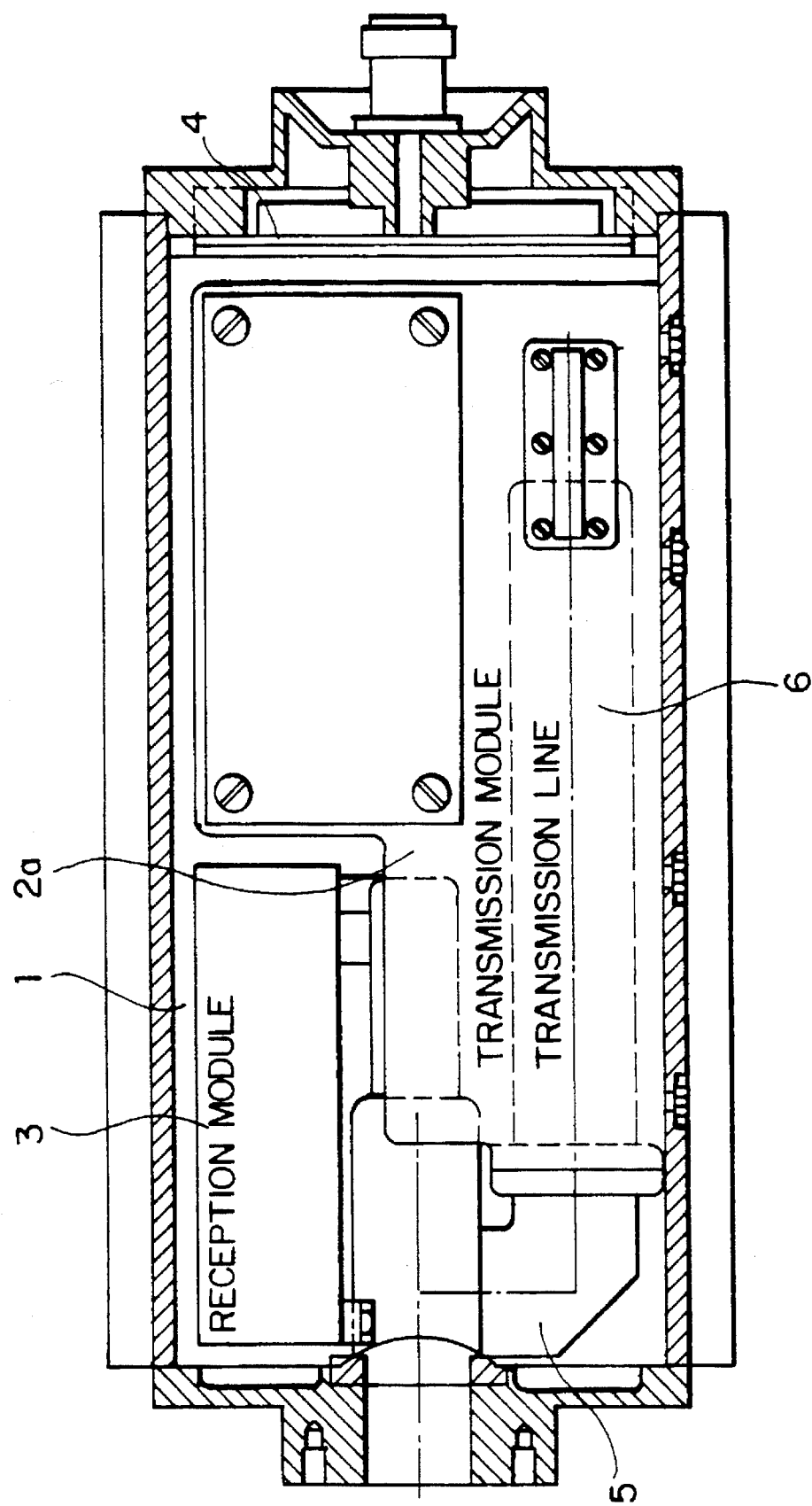
FIG. 1 is a longitudinal cross-sectional view of a conventional radio transceiver.
Figure 2:
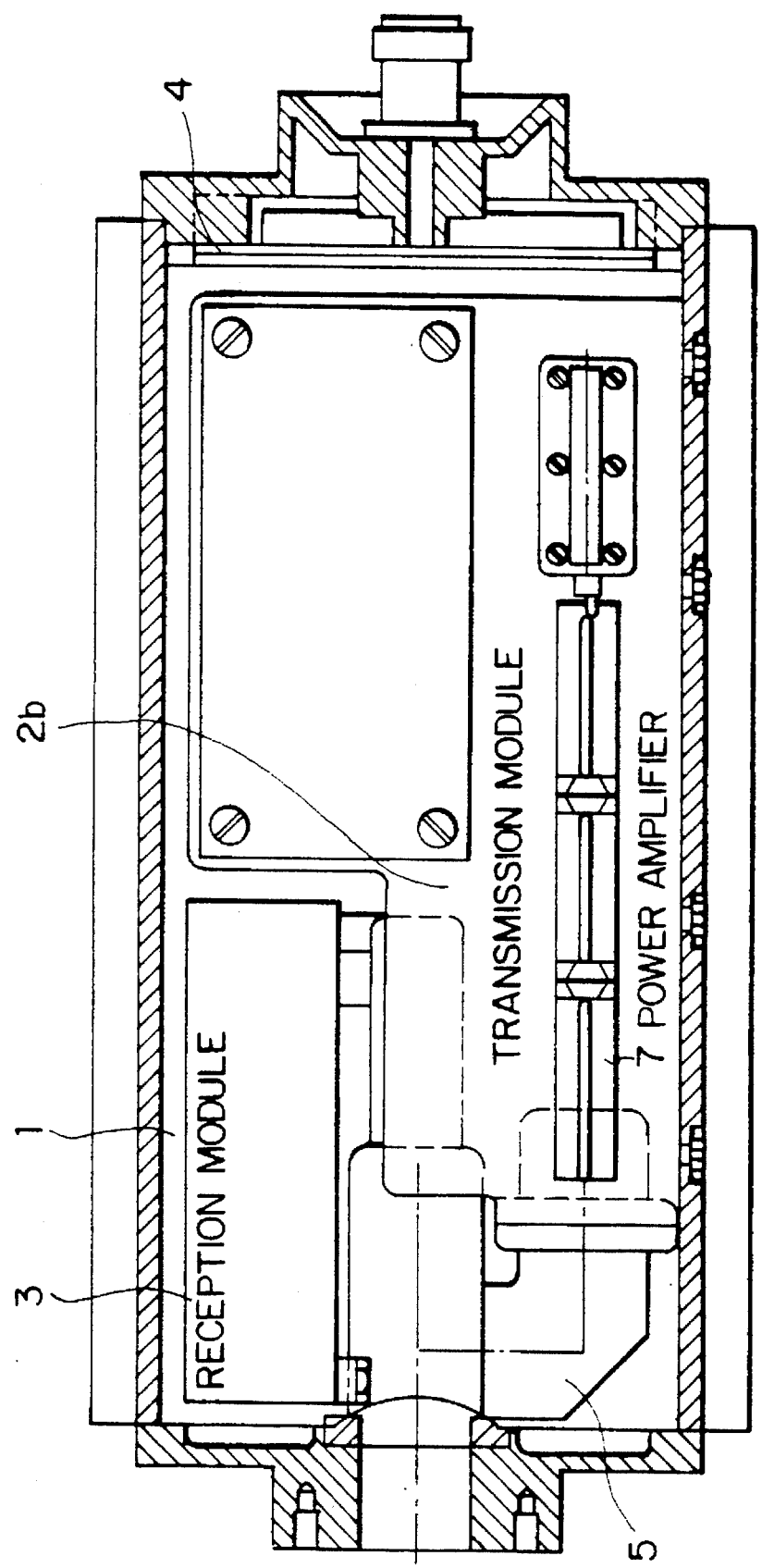
FIG. 2 is a longitudinal cross-sectional view of another conventional radio transceiver.
Figure 3:
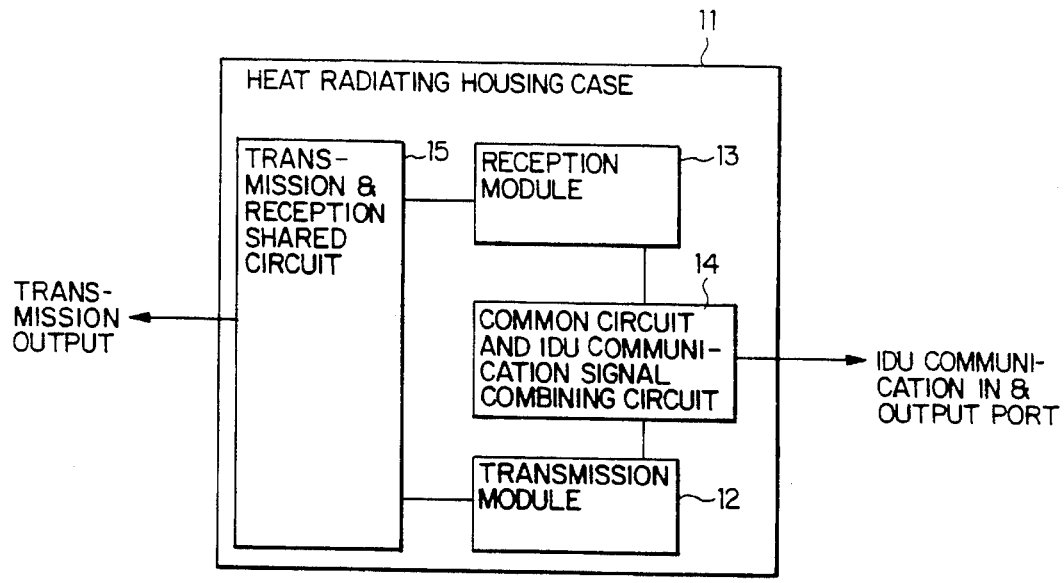
FIG. 3 is a block diagram of a radio transceiver for transmitting and receiving microwaves or higher frequency electromagnetic waves according to a first embodiment of the present invention.

As shown in FIG. 3, a radio transceiver for transmitting and receiving microwaves or higher frequency electromagnetic waves according to a first embodiment of the present invention has a minimum transmission output power requirement, and includes a heat radiating housing case 11 which accommodates transmission module 12, reception module 13, common circuit and IDU communication signal combining circuit 14, and transmission and reception shared circuit 15 including a filter. Common circuit and IDU communication signal combining circuit 14 includes a shared circuit for transmitting transmission and reception signals over one cable.

Transmission module 12 modulates a baseband signal inputted through common circuit and IDU communication signal combining circuit 14, and converts the modulated signal into a transmission signal into the microwave band. Reception module 13 converts a received microwave signal into an intermediate-frequency signal, demodulates the intermediate-frequency signal, and outputs the demodulated signal through the common circuit and IDU communication signal combining circuit 14 to an input/output port of an indoor communication unit. Transmission and reception shared circuit 15 is used to share one antenna (not shown) with transmission and reception functions. Transmission and reception shared circuit 15 leads a transmission signal from the transmission module 12 to the antenna, and leads a high-frequency signal received by the antenna to the reception module 13.

The radio transceiver with a minimum output power requirement does not have a power amplifier and consumes a minimum amount of electric power, i.e., generates a minimum amount of heat. The length of the heat radiating housing case 11 is the minimum required to radiate heat. Heat radiating housing case 11 is in the form of an extrusion-molded tubular case having a constant cross section. The length of heat radiating housing case 11 can be varied easily by cutting the extrusion-molded tubular case at a desired position. The radio transceiver with a minimum output power is designed as a basic model in a series of device products.

Figure 4:
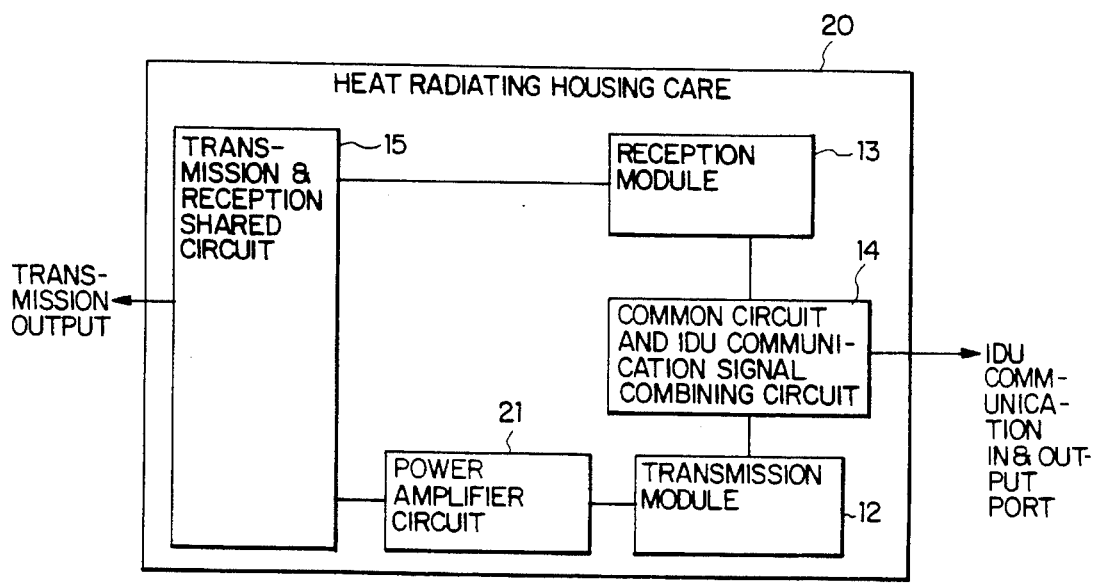
FIG. 4 is a block diagram of a radio transceiver for transmitting and receiving microwaves or higher frequency electromagnetic waves according to a second embodiment of the present invention.

FIG. 4 shows a radio transceiver according to a second embodiment of the present invention which has a medium transmission output power. The radio transceiver shown in FIG. 4 has heat radiating housing case 20 accommodating transmission module 12, reception module 13, common circuit and IDU communication signal combining circuit 14, transmission and reception shared circuit 15 including a filter, which are identical to those shown in FIG. 3, and power amplifier 21 and its power supply (not shown). Power amplifier 21 is connected between the output terminal of transmission module 12 and a transmission signal input terminal of transmission and reception shared circuit 15, for amplifying a transmission signal from transmission module 12.

The radio transceiver according to the second embodiment is a combination of the basic model shown in FIG. 3 and power amplifier 21. Heat radiating housing case 20 shown in FIG. 4, which is of a tubular shape, is of a minimum length required to additionally accommodate power amplifier 21 and also to radiate the heat generated by power amplifier 21. Specifically, the only differences between the two embodiments are that heat radiating housing case 20 of the radio transceiver according to the second embodiment is longer than heat radiating housing case 11 according to the first embodiment, and power amplifier 21 is added to the components housed in heat radiating housing case 20. The other details of the radio transceiver according to the second embodiment are the same as those of the radio transceiver according to the first embodiment.

Heat radiating housing case 20 is in the form of an extrusion-molded tubular case having a constant cross section. The only difference between the heat radiating housing case 20 and heat radiating housing case 11 according to the first embodiment is the greater length of case 20 in FIG. 4. According to the first conventional design approach described above, the device types of different transmission output power are individually designed, and their heat radiating housing cases have different lengths and cross section. According to the present invention, however, the heat radiating housing cases have different lengths but a constant cross section, and hence the heat radiating housing case can also be substantially standardized.

Figure 5:
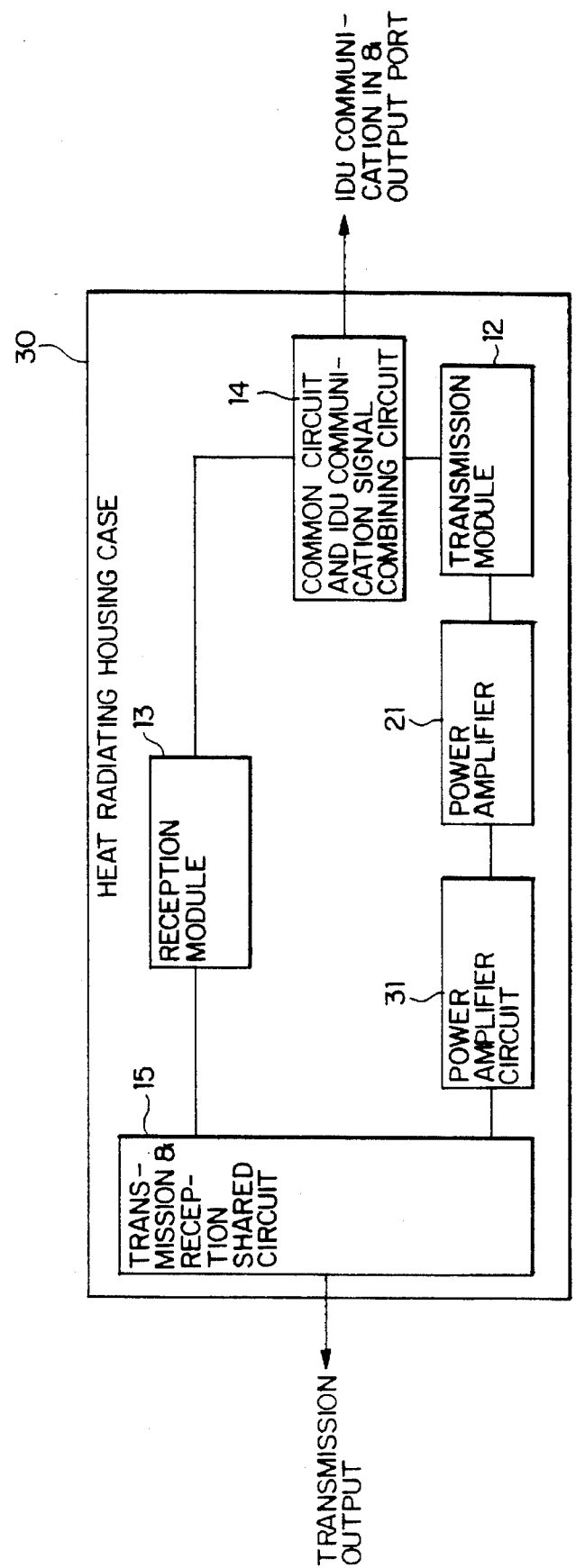
FIG. 5 is a block diagram of a radio transceiver for transmitting and receiving microwaves or higher frequency electromagnetic waves according to a third embodiment of the present invention.

FIG. 5 shows a radio transceiver according to a third embodiment of the present invention which has a transmission output power greater than that of the radio transceiver shown in FIG. 4. The radio transceiver shown in FIG. 5 has heat radiating housing case 30 which accommodates, in addition to those shown in FIG. 4, power amplifier 31 to meet a transmission output power greater than the transmission output power requirement of the device according to the second embodiment. Power amplifier 31 is connected between the output terminal of power amplifier 21 and the transmission signal input terminal of the transmission and reception shared circuit 15. Therefore, the radio transceiver according to the third embodiment is a combination of the basic model shown in FIG. 3 and power amplifiers 21, 31.

Heat radiating housing case 30 is of a minimum length required to radiate the heat generated by power amplifiers 21, 31. In heat radiating housing case 30, power amplifiers 21, 31 are the only additions to those in heat radiating housing case 11 shown in FIG. 3. The other details of the radio transceiver according to the third embodiment are the same as those of the radio transceiver according to the first embodiment.

The structure of each of the radio transceivers according to the respective embodiments will be described below.

Figure 6C:
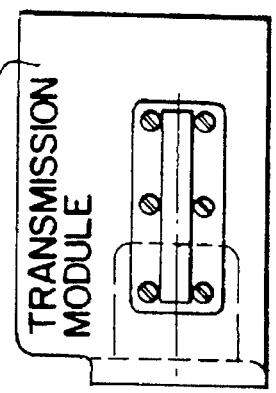
FIG. 6(c) shows enlonged view of transmission module 12.
Figure 6A:
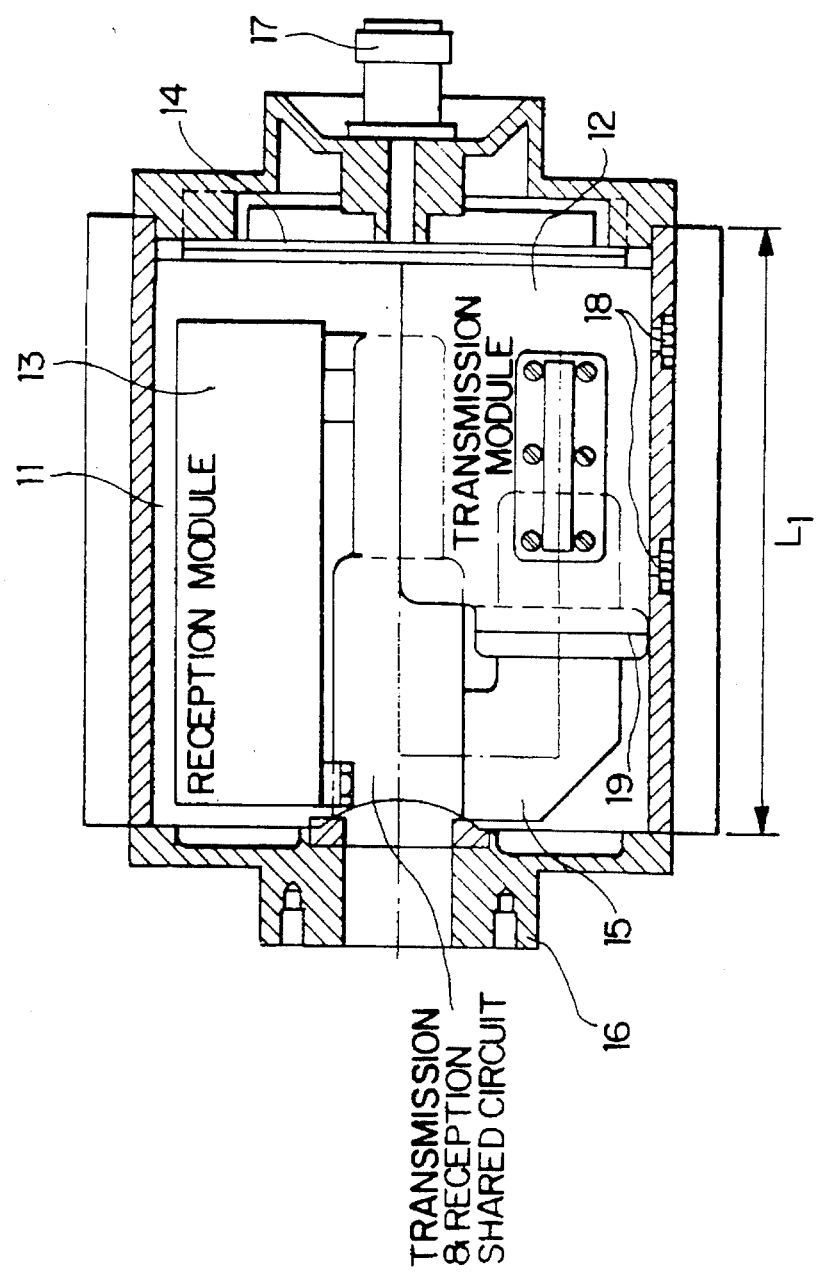

FIGS. 6(A) and 6(B) show in respective longitudinal and transverse cross sections the radio transceiver according to the first embodiment shown in FIG. 3. Those parts shown in FIGS. 6(A) and 6(B) which are identical to those shown in FIG. 3 are denoted by identical reference numerals. In FIGS. 6(A) and 6(B), the tubular heat radiating housing case 11 houses transmission module 12, reception module 13, common circuit and IDU communication signal combining circuit 14, and transmission and reception shared circuit 15 including a filter.

Heat radiating housing case 11 has antenna RF port 16 on its outer surface. Common circuit and IDU communication signal combining circuit 14 is connected to coaxial connector 17 which is coupled to an indoor unit. Transmission module 12 is fastened to heat radiating and housing case 11 by screws 18 so as to be directly held closely against an inner wall of housing case 11. The heat of transmission module 12, which consumes a relatively large amount of electrical energy and hence radiates a relatively large amount of heat, is dissipated directly outwardly by heat conduction through heat radiating housing case 11, which has a low thermal resistance. Accordingly, an increase in temperature in transmission module 12 is effectively prevented.

As shown in FIG. 6(A), the output terminal of transmission module 12 and the transmission signal input terminal of transmission and reception shared circuit 15 are connected by waveguide flange 19. Waveguide flange 19 allows a highly accurate RF connection to be made in a higher-frequency range of 10 GHz or higher, and also permits the terminals to be connected in a surface-to-surface contact perpendicular to the axis of tubular heat radiating housing case 11, whose length may be varied to accommodate an added power amplifier. Waveguide flange 19 is advantageous in that it allows the terminals to be connected more easily than a structure in which the terminals are connected by a connector composed of coupling sleeves that need to be tightened.

In the transceiver of the minimum transmission output power shown in FIGS. 6(A) and 6(B), the length $L_1$ of heat radiating housing case 11 is determined based on the power requirement of the device. The. radiator size is determined in view of the thermal resistance of a region from semiconductors housed in the device to the radiator so that any temperature rise of the semiconductors does not exceed the maximum temperature (generally called "maximum junction temperature") that is determined for individual semiconductors for worst environmental conditions. At any rate, the minimum size which meets the total power consumption of the device having the smallest transmission output power is selected for the radiator, i.e., heat radiating housing case 11.

Figure 7A:
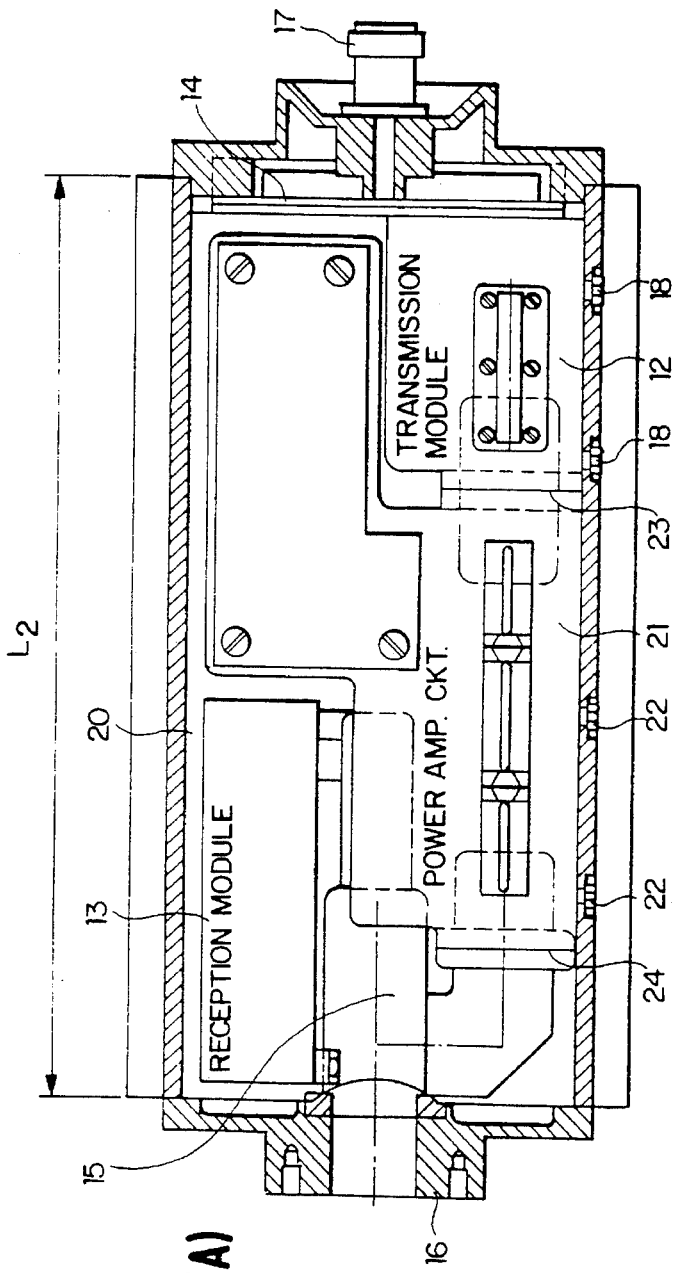
FIG. 7(A) is a longitudinal cross-sectional view of the radio transceiver according to the second embodiment shown in FIG. 4 and FIGS. 7(B) and 7(C) are enlarged views of power amplifier 21 and transmission module 12.
Figure 7B:
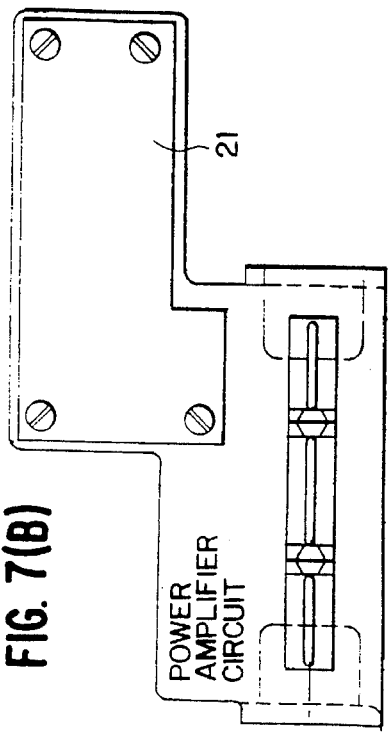
Figure 7C:
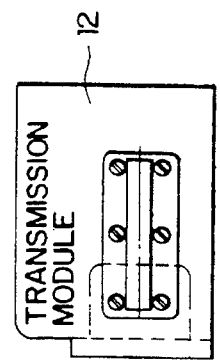
Figure 8:
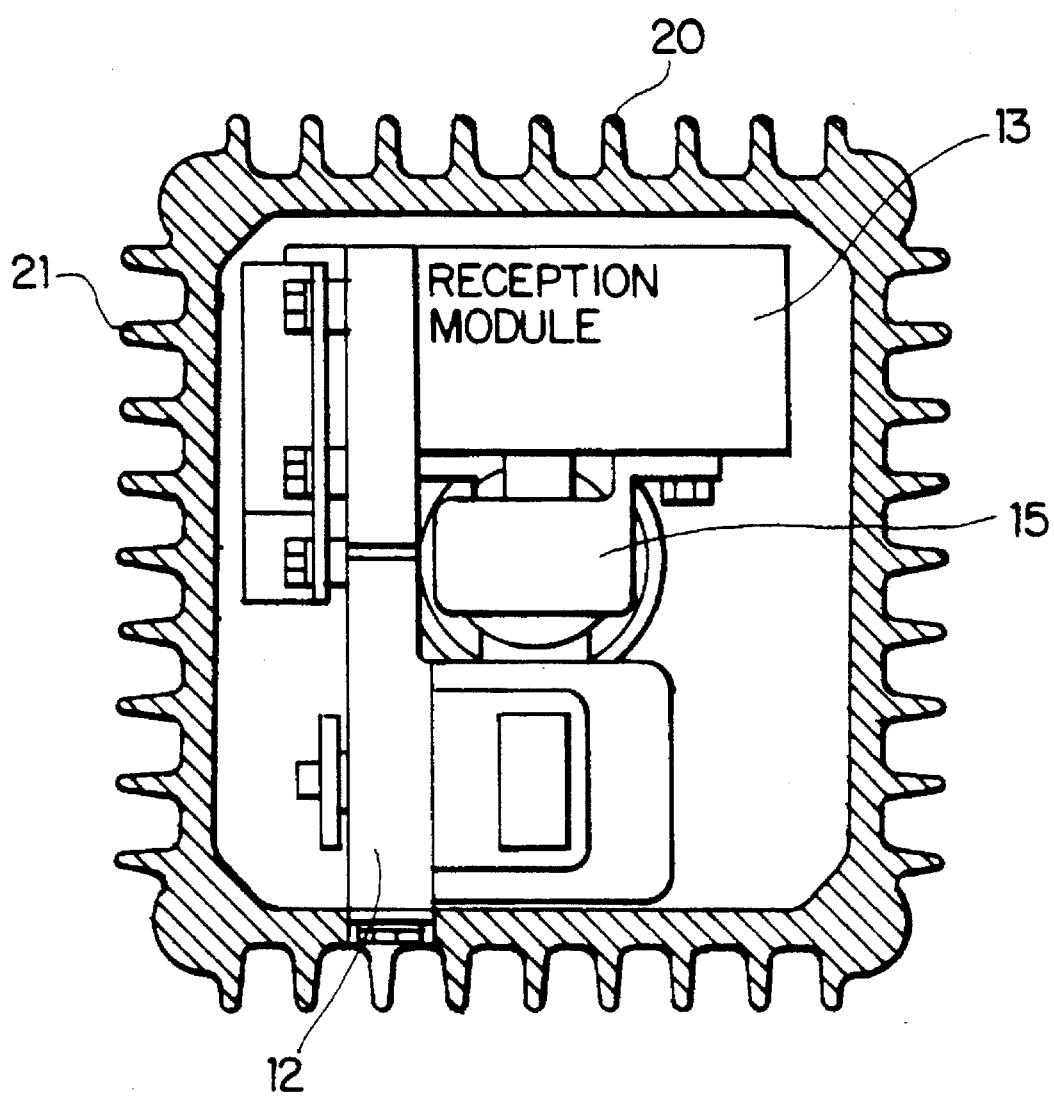
FIG. 8 is a transverse cross-sectional view of the radio transceiver according to the second embodiment shown in FIG. 4.

FIGS. 7(A) and 8 show in respective longitudinal and transverse cross sections the radio transceiver according to the second embodiment shown in FIG. 4. Those parts shown in FIGS. 7(A) and 8 which are identical to those shown in FIGS. 4 and 6(A) and 6(B) are denoted by identical reference numerals. In FIGS. 7(A) and 8, the tubular heat radiating housing case 20 houses transmission module 12, reception module 13, common circuit and IDU communication signal combining circuit 14, transmission and reception shared circuit 15 including a filter, and power amplifier 21 together with its power supply (not shown). Power amplifier 21 is connected between the output terminal of transmission module 12 and the transmission signal input terminal of transmission and reception shared circuit 15, for amplifying a transmission signal.

The radio transceiver shown in FIGS. 7(A) and 8 differs from the radio transceiver shown in FIGS. 6(A) and 6(B) in that power amplifier 21 is added, and tubular heat radiating housing case 20 is of length $L_2$ which is greater than length $L_1$ of the tubular heat radiating housing case 11 of the basic model in order to provide an increased cooling capacity by radiating an increased amount of heat produced by power amplifier 21. Tubular heat radiating housing case 20 has the same cross section as that of tubular heat radiating housing case 11. The other components in tubular heat radiating housing case 20, i.e., transmission module 12, reception module 13, common circuit and IDU communication signal combining circuit 14, transmission and reception shared circuit 15, are basically the same as those in heat radiating housing case 11.

As with transmission module 12, power amplifier 21 is fastened to heat radiating housing case 20 by screws 22 so as to be directly held closely against an inner wall of housing case 20. Heat from power amplifier 21 is dissipated directly outwardly by heat conduction through heat radiating housing case 20, which has a low thermal resistance. Accordingly, increase in temperature of power amplifier 21 is effectively prevented.

As shown in FIG. 7(A), the output terminal of transmission module 12 and the input terminal of power amplifier 21 are connected to each other by waveguide flange 23, and the output terminal of power amplifier 21 and transmission signal input terminal of the transmission and reception shared circuit 15 are connected to each other by waveguide flange 24, as with the first embodiment.

If a transceiver having a greater transmission output power requirement is needed, then a power amplifier which can meet the greater transmission output power requirement is added, and the length of the heat radiating housing case is increased to radiate the heat produced by the power consumption, in a manner described above with reference to FIG. 5.

As described above, with the present invention the components in the heat radiating housing case can be standardized with the exception of the power amplifier, and the heat radiating housing case itself can substantially be standardized. Therefore, the cost of an entire series of device products can be lowered irrespective of which type among various transceivers of different transmission output power capacities enjoys the highest sales. It is therefore possible to prevent disproportionate costs of transceivers having a transmission output power which are produced in a flow quantity.

Generally, transceivers of a type which is produced in low quantity require lower periods of time for manufacture and delivery because required parts are not in stock. According to the present invention, however, since the components other than the power amplifier are standardized or shared, the delivery of such transceivers produced in low quantity is not delayed.

Furthermore, because the transmission module and the power amplifier are directly held closely against the inner wall of the housing case, the heat generated by the transmission module and the power amplifier can effectively be dissipated outwardly, and hence undue increases in temperature in the transceiver are prevented.

In addition, the transmission module, the power amplifier, and the transmission and reception shared circuit are connected to each other by waveguides. The waveguides allow a highly accurate RF connection to be made in a high-frequency range of 10 GHz or higher, and also permit the terminals to be connected in a surface-to-surface contact perpendicular to the axis of the tubular heat radiating housing case. The waveguides are also advantageous in that they allow the terminals to be connected more easily than a structure in which the terminals are connected by a connector composed of coupling sleeves that need to be tightened.

Although certain preferred embodiments of the present invention has been shown and described in detail, it should be understood that various changes and modifications may be made therein without departing from the scope of the appended claims.

What is claimed is:

1. A radio transceiver with an integrated transmitter and receiver for transmitting and receiving microwaves or higher frequency electromagnetic waves, comprising:

a heat radiating housing case;

a transmission module housed in said heat radiating housing case for generating a transmission signal;

a reception module housed in said heat radiating housing case for demodulating a received signal;

a transmission and reception shared circuit housed in said heat radiating housing case for outputting the transmission signal to an antenna and outputting a signal received by the antenna to said reception module; and at least one power amplifier insertable between an output terminal of said transmission module and a transmission signal input terminal of said transmission and reception shared circuit for amplifying the transmission signal depending on a transmission output power requirements, wherein said heat radiating housing case includes a width, a height, and a length, wherein said width and height are constant irrespective of the number of power amplifiers and wherein said length is dependent on the number of power amplifiers, said length being smaller when said number of power amplifiers is reduced.

2. A radio transceiver according to claim 1, wherein said at least one power amplifier comprises a plurality of interconnected unit amplifiers each for amplifying the transmission signal depending on said transmission output power requirement.

3. A radio transceiver according to claim 1, wherein said transmission module and said at least one power amplifier are held closely against and fixed to an inner wall of said heat radiating housing case.

4. A radio transceiver according to claim 1, wherein said transmission module, said at least one power amplifier, and said transmission and reception shared circuit are interconnected by waveguides.

5. A radio transceiver with an integrated transmitter and receiver for transmitting and receiving microwaves or higher frequency electromagnetic waves, comprising:

a heat radiating housing case;

a transmission module housed in said heat radiating housing case for generating a transmission signal;

a reception module housed in said heat radiating housing case for demodulating a received signal;

a transmission and reception shared circuit housed in said heat radiating housing case for outputting the transmission signal to an antenna and outputting a signal received by the antenna to said reception module; and at least one power amplifier insertable between an output terminal of said transmission module and a transmission signal input terminal of said transmission and reception shared circuit for amplifying the transmission signal depending on a transmission output power requirement, wherein said heat radiating housing case includes a width, a height, and a length, wherein said width and height are constant irrespective of said transmission output power requirement and wherein said length is dependent on said transmission output power requirement, said length being smaller when said transmission output power requirement is reduced.

* * * * *